US011100979B1

United States Patent
Wang et al.

(10) Patent No.: US 11,100,979 B1
(45) Date of Patent: Aug. 24, 2021

(54) LOW-POWER SRAM MEMORY CELL AND APPLICATION STRUCTURE THEREOF

(71) Applicant: SHANGHAITECH UNIVERSITY, Shanghai (CN)

(72) Inventors: Yuqi Wang, Shanghai (CN); Yajun Ha, Shanghai (CN)

(73) Assignee: SHANGHAITECH UNIVERSITY, Shanghai (CN)

( * ) Notice: Subject to any disclaimer, the term of this patent is extended or adjusted under 35 U.S.C. 154(b) by 0 days.

(21) Appl. No.: 17/051,783

(22) PCT Filed: Jun. 17, 2020

(86) PCT No.: PCT/CN2020/096479
§ 371 (c)(1),
(2) Date: Oct. 30, 2020

(87) PCT Pub. No.: WO2021/057114
PCT Pub. Date: Apr. 1, 2021

(30) Foreign Application Priority Data

Sep. 26, 2019 (CN) .......................... 201910916322.3

(51) Int. Cl.
*G11C 11/412* (2006.01)
*H01L 27/11* (2006.01)
*G11C 11/419* (2006.01)

(52) U.S. Cl.
CPC .......... *G11C 11/412* (2013.01); *G11C 11/419* (2013.01); *H01L 27/1104* (2013.01)

(58) Field of Classification Search
CPC .. G11C 11/412; G11C 11/419; H01L 27/1104
See application file for complete search history.

(56) References Cited

U.S. PATENT DOCUMENTS 8,179,715 B2 * 5/2012 Houston ............... G11C 11/412
365/154
2008/0259681 A1 10/2008 Branch et al.

FOREIGN PATENT DOCUMENTS

| CN | 105336363 A | 2/2016 |
|----|-------------|--------|
| CN | 109784483 A | 5/2019 |
| CN | 110058839 A | 7/2019 |
| CN | 110970071 A | 4/2020 |

* cited by examiner

*Primary Examiner* — David Lam
(74) *Attorney, Agent, or Firm* — Bayramoglu Law Offices LLC

(57) ABSTRACT

A low-power SRAM memory cell includes five word lines and four bit lines. The five word lines are a first word line, a second word line, a third word line, a fourth word line and a fifth word line. The four bit lines are a first bit line, a second bit line, a third bit line, and a fourth bit line. During the operation process of calculating a binary 10×11, the first word line is 1, the second word line is 0, the third word line is 0, the fourth word line is 1, the high bit stored in the bit cell is 1, and the low bit is 1. The voltage value of the fifth word line is 0.73 volt. At this time, the first bit line, the second bit line, and the third bit line do not discharge, while the fourth bit line discharges.

2 Claims, 1 Drawing Sheet

LOW-POWER SRAM MEMORY CELL AND APPLICATION STRUCTURE THEREOF

CROSS REFERENCE TO THE RELATED APPLICATIONS

This application is the national phase entry of International Application No. PCT/CN2020/096479, filed on Jun. 17, 2020, which is based upon and claims priority to Chinese Patent Application No. 201910916322.3, filed on Sep. 26, 2019, the entire contents of which are incorporated herein by reference.

TECHNICAL FIELD

The present invention relates to a two-bit by two-bit low-power static random-access memory (SRAM) memory cell based on input data, additionally, the present invention also relates to an application structure of the SRAM memory cell.

BACKGROUND

In-memory computing units based on input data are novel SRAM memory cells that realize in-memory computing of multi-bit multiplication. Data computation in traditional computer architectures typically requires multiple clock cycles and consumes a lot of power. The in-memory computing method, on the other hand, enables the memory cell to have the function of data calculation while it performs the function of data storage, and directly reads the calculation results during the reading process. However, in the in-memory operation mode, there is a trade-off between output accuracy and energy consumption. Furthermore, the reading speed of in-memory computing should be maintained at the same reading speed of the traditional corresponding memory.

Currently, in-memory computing units based on input data in SRAM have a traditional 8T bit cell structure and utilize analog-to-digital converter. During one reading process, to achieve a basic unit of multi-bit multiplication and make multi-bit multiplication in the in-memory computing mode possible, a two-bit by two-bit multiplication result is read directly.

To perform multiplication in SRAM, the required circuit modules include row decoder, column decoder, pre-charge module, bit cell array, sensor amplifier, and write driver. The signals required to complete a two-bit by two-bit multiplication include clock signal, address signal, external two-bit multiplier information as input signal, and multiplicand information that is stored in the bit cell array.

In an 8T SRAM bit cell, the read operation of the stored information is controlled by the word line signal of a certain row. The discharge result is shown on the bit line. When two 8T bit cells share a bit line, after the read operation is completed, the analog voltage value of this bit line is the result of the common discharge of the two 8T bit cells.

Since the multiplicand is stored in two 8T bit cells that share a bit line, changing the width of the channel transistor that is connected to the memory point of the 8T bit cell and the bit line can change the discharge speed, namely, the larger the width, the faster the discharge speed, which represents the stored high-level information. On the contrary, smaller width corresponds to the storage of relatively low-level information.

The multiplier signal and the address signal are both input to the row decoder together, they are corresponding to the voltage drive that has four different voltage values in the word line, the analog voltage value of the bit line after the discharge is completed represents the result of one multiplication operation.

One disadvantage of performing multiplication in analog is that its output has a fixed accuracy level, and with the increasing inference accuracy of deep neural network, the requirements for accuracy level and speed of the analog-to-digital conversion also increase. Also, the voltage swing of the bit line caused by the analog voltage value is large, which is not helpful for the stability of the output result. For example, to distinguish multiplication results of two-bit by two-bit, such as these seven numbers: 0, 1, 2, 3, 4, 6, 9, the voltage swing of the bit line should be 1 volt, and generally it cannot be reduced.

The multiplication operation can also be performed in digital by implementing partial addition and shift addition in a bit cell array. Without the requirement of distinguishing the different analog voltage values, certain low-power designs for the bit cell array can be utilized to reduce the bit line voltage, as long as the bit cell array can perform read and write functions normally, the multiplication operation can be completed with reduced energy consumption.

Performing multiplication operation in digital format as mentioned above is scalable, by enabling users to arbitrarily change the bits of the input data and weights and select the accuracy of the output result, the calculations can reach full precision.

During one read cycle, one or two word lines are turned on, and the signs for the intermediate carry and whether to add operation are both stored in the two rows of registers at the bottom of the bit cell. This method of calculation in digital format is considered a kind of memory-side computing, an improvement based on the traditional structure.

The calculation result is the result of one-bit addition, multi-bit addition is an implementation of one-bit addition in multiple cycles, and multi-bit multiplication is multi-bit shift addition implemented in multiple cycles. The calculation process is controlled by certain timing signals, and additional registers are required to store carry information and shift information.

One disadvantage of performing multiplication operation in digital format as mentioned above is that more than one clock cycle is required. For example, a four-bit addition operation requires four clock cycles, and a two-bit multiplication requires seven clock cycles. Multiple clock cycles are required because this method uses each column as a unit for parallel operation and performs serial operation during the calculation of each column.

SUMMARY

An objective of the present invention is to provide an SRAM memory cell that can be directly used for two-bit by two-bit multiplication calculation, and to optimize the power consumption associated with the read operation.

To achieve the above-mentioned objective, the present invention provides a low-power SRAM memory cell, including five word lines and four bit lines. The five word lines are a first word line, a second word line, a third word line, a fourth word line, and a fifth word line. The four bit lines are a first bit line, a second bit line, a third bit line, and a fourth bit line.

The first bit line is connected to the source of a P-channel Metal Oxide Semiconductor (PMOS) transistor Q1, the second word line is connected to the gate of the PMOS transistor Q1, and the drain of the PMOS transistor Q1 is connected to the drain of an N-channel Metal Oxide Semiconductor (NMOS) transistor Q2, the gate of an NMOS transistor Q3, the drain of a PMOS transistor Q4, and the gate of a PMOS transistor Q5. The source of the NMOS transistor Q2 and the source of the NMOS transistor Q3 are connected to VCC. The source of the PMOS transistor Q4 and the source of the PMOS transistor Q5 are grounded.

The drain of the PMOS transistor Q6 is connected to the gate of the NMOS transistor Q2, the drain of the NMOS transistor Q3, the gate of the PMOS transistor Q4, the drain of the PMOS transistor Q5, and the gate of the PMOS transistor Q7. The gate of the PMOS transistor Q6 is connected to the first word line, and the source of PMOS transistor Q6 is connected to the second bit line.

The source of the PMOS transistor Q7 is grounded, and the drain of the PMOS transistor Q7 is connected to the drain of the PMOS transistor Q8. The gate of the PMOS transistor Q8 is connected to the fifth word line, and the source of the PMOS transistor Q8 is connected to a read bit line.

The fourth bit line is connected to the source of a PMOS transistor Q9, the fourth word line is connected to the gate of the PMOS transistor Q9, and the drain of the PMOS transistor Q9 is connected to the drain of an NMOS transistor Q10, the gate of an NMOS transistor Q11, and the drain of a PMOS transistor Q12, and the gate of a PMOS transistor Q13. The source of the NMOS transistor Q10 and the source of the NMOS transistor Q11 are connected to VCC. The source of the PMOS transistor Q12 and the source of the PMOS transistor Q13 are grounded.

The drain of a PMOS transistor Q14 is connected to the gate of the NMOS transistor Q10, the drain of the NMOS transistor Q11, the gate of the PMOS transistor Q12, the drain of the PMOS transistor Q13, and the gate of a PMOS transistor Q15. The gate of the PMOS transistor Q14 is connected to the third word line, and the source of the PMOS transistor Q14 is connected to the third bit line.

The source of the PMOS transistor Q15 is grounded, and the drain of the PMOS transistor Q15 is connected to the drain of a PMOS transistor Q16. The gate of the PMOS transistor Q16 is connected to the fifth word line, and the source of the PMOS transistor Q16 is connected to the read bit line.

Preferably, an application structure includes N rows and M columns of the memory cells, for the $n^{th}$ row of memory cells in the $m^{th}$ column of memory cells, m=1, 2, . . . , M, and n=1, 2, . . . , N, wherein:

the first word line, the second word line, the third word line, and the fourth word line of the current memory cell are connected to the $n^{th}$ bit input; the first bit line, the second bit line, the third bit line, and the fourth bit line of the current memory cell, and the first bit lines, the second bit lines, the third bit lines, and the fourth bit lines of all other memory cells in the current $m^{th}$ column of memory cells form the $m^{th}$ bit output; and the read bit line of the current memory cell is connected to the fifth word line of the memory cell in the $(n+1)^{th}$ row in the $m^{th}$ column of the memory cells.

Compared with the state-of-the-art technology, the structure of the present invention reduces energy consumption to 24.5%, and has the following advantages:

(1) The positive correlation between Complementary Metal-Oxide-Semiconductor Transistor (CMOS) channel current and gate voltage enables a set of analog voltages to be used as the gate voltage to drive SRAM for read operations, so that the voltage analog value on the bit line can be used to represent the result of the multiplication in the same turn-on time.

(2) Based on the existing two-bit by two-bit SRAM bit cell, the word line (WWL) that controls the write bit line (BL) is combined with the input data, so that the multiplication represented by the analog voltage value is only used for when the multiplier is different from the multiplicand, thereby reducing the possible voltage swing of the read bit line (RBL).

(3) In addition, based on the structure of the present invention, a new input-based method of storing and calculating two-bit by two-bit multiplications is provided.

DETAILED DESCRIPTION OF THE EMBODIMENTS

The present invention will be further described below in conjunction with specific embodiments. It should be understood that these embodiments are only used to illustrate the present invention rather than to limit the scope of the present invention. In addition, it should be understood that based on the embodiments of the present invention, all other embodiments obtained by those skilled in the art without creative efforts shall fall within the scope defined by the appended claims of the present invention.

Figure 1:
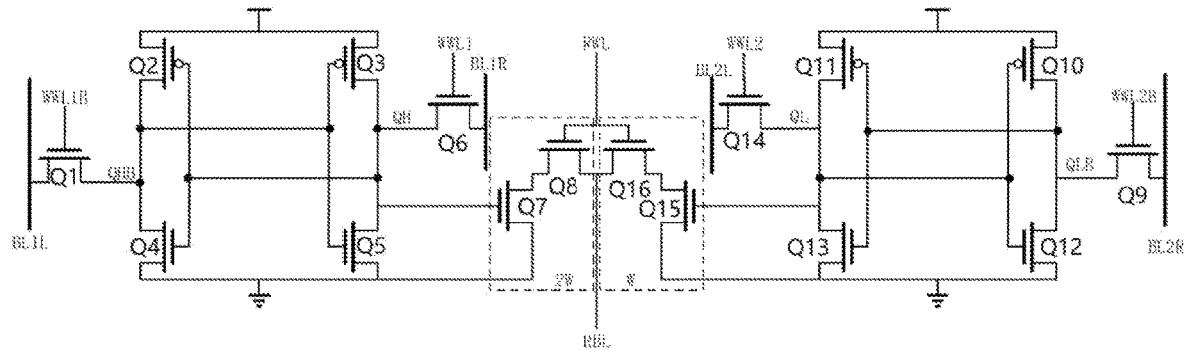
FIG. 1 is a schematic diagram of a low-power SRAM memory cell according to the present invention.

As shown in FIG. 1, the present invention provides a low-power SRAM memory cell, including five word lines and four bit lines, the five word lines are the first word line WWL1, the second word line WWL1B, the third word line WWL2, the fourth word line WWL2B, and the fifth word line RWL. The four bit lines are the first bit line BL1L, the second bit line BL1R, the third bit line BL2L, and the fourth bit line BL2R.

The first bit line BL1L is connected to the source of the PMOS transistor Q1, the second word line WWL1B is connected to the gate of the PMOS transistor Q1, and the drain of the PMOS transistor Q1 is connected to the drain of the NMOS transistor Q2, the gate of the NMOS transistor Q3, the drain of the PMOS transistor Q4, and the gate of the PMOS transistor Q5. The source of the NMOS transistor Q2 and the source of the NMOS transistor Q3 are connected to VCC. The source of the PMOS transistor Q4 and the source of the PMOS transistor Q5 are grounded.

The drain of the PMOS transistor Q6 is connected to the gate of the NMOS transistor Q2, the drain of the NMOS transistor Q3, the gate of the PMOS transistor Q4, the drain of the PMOS transistor Q5, and the gate of the PMOS transistor Q7. The gate of the PMOS transistor Q6 is connected to the first word line WWL1, and the source of the PMOS transistor Q6 is connected to the second bit line BL1R.

The source of the PMOS transistor Q7 is grounded, and the drain of the PMOS transistor Q7 is connected to the drain of the PMOS transistor Q8. The gate of the PMOS transistor Q8 is connected to the fifth word line RWL, and the source of the PMOS transistor Q8 is connected to the read bit line RBL.

The fourth bit line BL2R is connected to the source of the PMOS transistor Q9, the fourth word line WWL2B is connected to the gate of the PMOS transistor Q9, and the drain of the PMOS transistor Q9 is connected to the drain of the NMOS transistor Q10, the gate of the NMOS transistor Q11, the drain of the PMOS transistor Q12, and the gate of the PMOS transistor Q13. The source of the NMOS transistor Q10 and the source of the NMOS transistor Q11 are connected to VCC. The source of the PMOS transistor Q12 and the source of the PMOS transistor Q13 are grounded.

The drain of the PMOS transistor Q14 is connected to the gate of the NMOS transistor Q10, the drain of the NMOS transistor Q11, the gate of the PMOS transistor Q12, the drain of the PMOS transistor Q13, and the gate of the PMOS transistor Q15. The gate of the PMOS transistor Q14 is connected to the third word line WWL2, and the source of the PMOS transistor Q14 is connected to the third bit line BL2L.

The source of the PMOS transistor Q15 is grounded, and the drain of the PMOS transistor Q15 is connected to the drain of the PMOS transistor Q16. The gate of the PMOS transistor Q16 is connected to the fifth word line RWL, and the source of the PMOS transistor Q16 is connected to the read bit line RBL.

Figure 2:
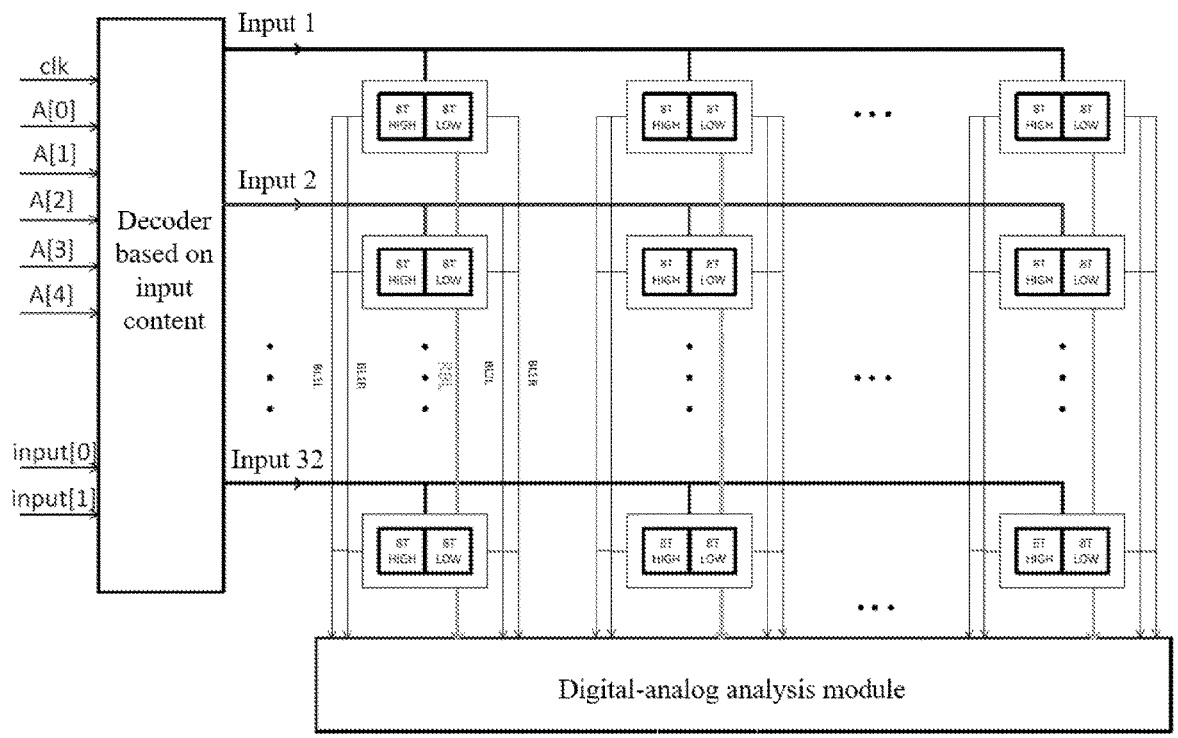
FIG. 2 is a schematic diagram of an application structure according to the present invention.

As shown in FIG. 2, an application structure according to the present invention includes N rows and M columns of the memory cells, for the $n^{th}$ row of memory cells in the $m^{th}$ column of memory cells, m=1, 2, . . . , M, and n=1, 2, . . . , N, wherein:

the first word line WWL1, the second word line WWL1B, the third word line WWL2, and the fourth word line WWL2B of the current memory cell are connected to the $n^{th}$ bit input given by the decoder based on the input content; the first bit line BL1L, the second bit line BL1R, the third bit line BL2L, and the fourth bit line BL2R of the current memory cell and the first bit lines BL1L, the second bit lines BL1R, the third bit lines BL2L, and the fourth bit lines BL2R of all other memory cells in the current $m^{th}$ column of memory cells form the $m^{th}$ bit output and provide it to the data analysis module; and the read bit line RBL of the current memory cell is connected to the fifth word line RWL of the memory cell in the $(n+1)^{th}$ row in the $m^{th}$ column of the memory cells.

The present invention is based on the working mode of the traditional SRAM. During a read operation, a row of bit cells are turned on to perform a two-bit by two-bit multiplication. For example, during the operation process of calculating a binary 10×11, the first word line WWL1 is 1, the second word line WWL1B is 0, the third word line WWL2 is 0, the fourth word line WWL2B is 1, the high bit QH stored in the bit cell is 1, and the low bit QL is 1. The voltage value of the fifth word line RWL is 0.73 volt. At this time, the first bit line BL1L, the second bit line BL1R, and the third bit line BL2L do not discharge, while the fourth bit line BL2R discharges. The input and output are different, and the result is the analog voltage value of the shared analog bit line. The result obtained by a digital-analog analysis module is 0110.

What is claimed is:

1. A low-power SRAM memory cell, comprising:
a first word line, a second word line, a third word line, a fourth word line, a fifth word line, a first bit line, a second bit line, a third bit line, and a fourth bit line;
wherein the first bit line is connected to a source of a first PMOS transistor, the second word line is connected to a gate of the first PMOS transistor, and a drain of the first PMOS transistor is connected to a drain of a first NMOS transistor, a gate of a second NMOS transistor, a drain of a second PMOS transistor, and a gate of a third PMOS transistor;
a source of the first NMOS transistor and a source of the second NMOS transistor are connected to a VCC;
a source of the second PMOS transistor and a source of the third PMOS transistor are grounded;
a drain of a fourth PMOS transistor is connected to a gate of the first NMOS transistor, a drain of the second NMOS transistor, a gate of the second PMOS transistor, a drain of the third PMOS transistor, and a gate of a fifth PMOS transistor;
a gate of the fourth PMOS transistor is connected to the first word line;
a source of the fourth PMOS transistor is connected to the second bit line;
a source of the fifth PMOS transistor is grounded, and a drain of the fifth PMOS transistor is connected to a drain of a sixth PMOS transistor;
a gate of the sixth PMOS transistor is connected to the fifth word line, and a source of the sixth PMOS transistor is connected to a read bit line;
the fourth bit line is connected to a source of a seventh PMOS transistor, the fourth word line is connected to a gate of the seventh PMOS transistor, and a drain of the seventh PMOS transistor is connected to a drain of a third NMOS transistor, a gate of a fourth NMOS transistor, a drain of an eighth PMOS transistor, and a gate of a ninth PMOS transistor;
a source of the third NMOS transistor and a source of the fourth NMOS transistor are connected to the VCC;
a source of the eighth PMOS transistor and a source of the ninth PMOS transistor are grounded;
a drain of a tenth PMOS transistor is connected to a gate of the third NMOS transistor, a drain of the fourth NMOS transistor, a gate of the eighth PMOS transistor, a drain of the ninth PMOS transistor, and a gate of an eleventh PMOS transistor;
a gate of the tenth PMOS transistor is connected to the third word line, and a source of the tenth PMOS transistor is connected to the third bit line;
a source of the eleventh PMOS transistor is grounded, and a drain of the eleventh PMOS transistor is connected to a drain of a twelfth PMOS transistor; and
a gate of the twelfth PMOS transistor is connected to the fifth word line, and a source of the twelfth PMOS transistor is connected to the read bit line.

2. An application structure of the low-power SRAM memory cell according to claim 1, comprising
N rows and M columns of the low-power SRAM memory cells according to claim 1;
wherein for an $n^{th}$ row of memory cells in an $m^{th}$ column of memory cells, m=1, 2, . . . , M, and n=1, 2, . . . , N, wherein:
the first word line, the second word line, the third word line, and the fourth word line of a current low-power SRAM memory cell are connected to an $n^{th}$ bit input;
the first bit line, the second bit line, the third bit line, and the fourth bit line of the current low-power SRAM memory cell in the $m^{th}$ column of the low-power SRAM memory cells and the first bit lines, the second bit lines, the third bit lines, and the fourth bit lines of the rest of low-power SRAM memory cells in the $m^{th}$ column of the low-power SRAM memory cells form an $m^{th}$ bit output; and
the read bit line of the current low-power SRAM memory cell is connected to the fifth word line of a low-power SRAM memory cell in an $(n+1)^{th}$ row in the $m^{th}$ column of the memory cells.

* * * * *